United States Patent
Fifield

(10) Patent No.: US 7,466,188 B2
(45) Date of Patent: Dec. 16, 2008

(54) STRESS CONTROL MECHANISM FOR USE IN HIGH-VOLTAGE APPLICATIONS IN AN INTEGRATED CIRCUIT

(75) Inventor: John A. Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 11/614,750

(22) Filed: Dec. 21, 2006

(65) Prior Publication Data

US 2008/0150617 A1    Jun. 26, 2008

(51) Int. Cl.
*G05F 1/10* (2006.01)
(52) U.S. Cl. ...................................... 327/536
(58) Field of Classification Search ............... 327/535, 327/536, 537
See application file for complete search history.

(56) References Cited

U.S. PATENT DOCUMENTS

| | | | |
|---|---|---|---|
| 4,616,303 A | | 10/1986 | Mauthe |
| 5,521,546 A | * | 5/1996 | Kim ............................ 327/536 |
| 6,072,358 A | | 6/2000 | Hung et al. |
| 6,236,581 B1 | | 5/2001 | Foss et al. |
| 6,316,985 B1 | * | 11/2001 | Kobayashi et al. .......... 327/536 |
| 6,466,079 B1 | | 10/2002 | Kushnarenko |
| 6,762,640 B2 | * | 7/2004 | Katsuhisa .................... 327/536 |
| 6,828,849 B2 | * | 12/2004 | Nakamura ................... 327/536 |
| 7,034,601 B2 | * | 4/2006 | Carmina et al. ............. 327/536 |
| 7,046,076 B2 | | 5/2006 | Daga et al. |
| 7,323,927 B2 | * | 1/2008 | Menke ......................... 327/536 |

OTHER PUBLICATIONS

Ming-Dou Ker, Shih-Lun Chen, Chia-Shen Tsai; "Design of Charge Pump Circuit with Consideration of Gate-Oxide Reliability in Low-Voltage CMOS Processes," IEEE Journal of Solid-State Circuits, vol. 41, No. 5, May 2006, pp. 1100-1107.

Ming-Dou Ker, Shih-Lun Chen, Chia-Shen Tsai; "A New Charge Pump Circuit Dealing with Gate-Oxide Reliability Issue in Low-Voltage Processes," IEEE Journal of Solid-State Circuits, ISCAS 2004, pp. 1-321-1-324.

(Continued)

*Primary Examiner*—Jeffrey S Zweizig
(74) *Attorney, Agent, or Firm*—Downs Rachlin Martin PLLC

(57) ABSTRACT

A voltage pump circuit that has an oxide stress control mechanism is disclosed. In particular, the oxide stress control mechanism of the voltage pump circuit ensures a safe transistor gate-to-source voltage in high-voltage applications in an integrated circuit. In particular, the down level of the gate voltage of the output transistor may be conditionally limited. For example, an offset in the down level of the gate voltage is created by conditionally developing an offset voltage in the lower rail voltage of the gate driver. The offset voltage is created by directing a predetermined current through a resistance. The current is conditional such that the current is about zero when the power supply voltage is less than or equal to a predetermined level, and the current is greater than zero when the power supply voltage is greater than a predetermined level.

14 Claims, 2 Drawing Sheets

OTHER PUBLICATIONS

Tawfique Hasan, Torsten Lehmann, Chee Yee Kwok, "A 5V Charge Pump in a Standard 1.8-V 0.18-um CMOS Process," IEEE, 2005, pp. 1899-1902.

Kyeong-Sik Min, Young-Hee Kim, Jin-Hong Ahn, Jin-Yong Chung, and Takayasu Sakurai, "CMOS Charge Pumps Using Cross-Coupled Charge Transfer Switches with Improved Voltage Pumping Gain and Low Gate-Oxide Stress for Low-Voltage Memory Circuits," IEEE, 2002, pp. V-545-V548.

Feng Su, Wing-Hun Ki and Chi-Ying Tsui, "Gate Control Strategies for High Efficiency Charge Pumps," IEEE, 2005, pp. 1907-1910.

* cited by examiner

US 7,466,188 B2

STRESS CONTROL MECHANISM FOR USE IN HIGH-VOLTAGE APPLICATIONS IN AN INTEGRATED CIRCUIT

FIELD OF THE DISCLOSURE

The present disclosure generally relates to the field of managing oxide stress conditions in an integrated circuit. In particular, the present disclosure is directed to a voltage pump circuit that has an oxide stress control mechanism for use in high-voltage applications in an integrated circuit.

BACKGROUND

Voltage pump circuits, which are voltage-multiplier circuits, are needed in embedded dynamic random access memory (EDRAM) and other integrated circuits, for example, to drive wordlines and provide boosted supply nodes for high-voltage applications. High-voltage oxide stress, for example, excessive transistor gate-to-source voltage, within the voltage pump circuit can cause a reliability problem when high-performance thin-oxide devices are used. Thicker oxide devices could be used in order to avoid voltage stress problems, but thick-oxide devices may not be available in the technology menu of, for example, cost sensitive EDRAM designs. Diode circuits have been used in the rectifying path of voltage pump circuits instead of switched devices in order to avoid stress problems, but the use of series diodes reduces the high-voltage output of the voltage pump by a diode voltage (Vbe) or by a field-effect transistor threshold voltage (FET-Vt), which is unacceptable.

A need exists for a voltage pump circuit that has an oxide stress control mechanism, in order to ensure a safe transistor gate-to-source voltage in high-voltage applications in an integrated circuit.

SUMMARY OF THE DISCLOSURE

In one embodiment, the present disclosure is directed to a stress control mechanism for use in a high voltage application in an integrated circuit. The integrated circuit designed to substantially operate at a supply voltage. The integrated circuit comprises circuitry requiring a boosted voltage relative to the supply voltage. The integrated circuit also comprises a voltage pump that includes an output device in electrical communication with the circuitry so as to provide the circuitry with the boosted voltage, the output device driven by a gate voltage having a gate drive level and including a gate-oxide having an excessive stress voltage level. The integrated circuit further comprises a gate voltage controller for generating the gate drive level so as to maintain the gate oxide below the excessive stress level.

In another embodiment, the present disclosure is directed to an integrated circuit designed to operate at a supply voltage. The integrated circuit comprises voltage pump circuitry that includes an output device having a gate drive level and including a gate oxide having an excessive stress level. The integrated circuit further comprises a gate voltage controller electrically connected to the output device so as to provide the gate drive level, the gate voltage controller configured to vary the gate drive level as a function of the supply voltage.

In a further embodiment, the present disclosure is directed to an integrated circuit. The integrated circuit comprises a voltage pump circuit including an output transistor having a gate input and responsive to a gate drive level. A voltage pump control circuit is electrically connected to the gate input of the output transistor and is configured to output the gate drive level in response to a reference current. A reference current generator is electrically connected to the voltage pump control circuit so as to provide the voltage pump control circuit with the reference current. The reference current generator is configured to generate the reference current as a function of a first reference voltage and a second reference voltage. A first reference voltage generator is electrically connected to the reference current generator for providing the first reference voltage to the reference current generator. A second reference voltage generator is electrically connected to the reference current generator for providing the second reference voltage to the current generator.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
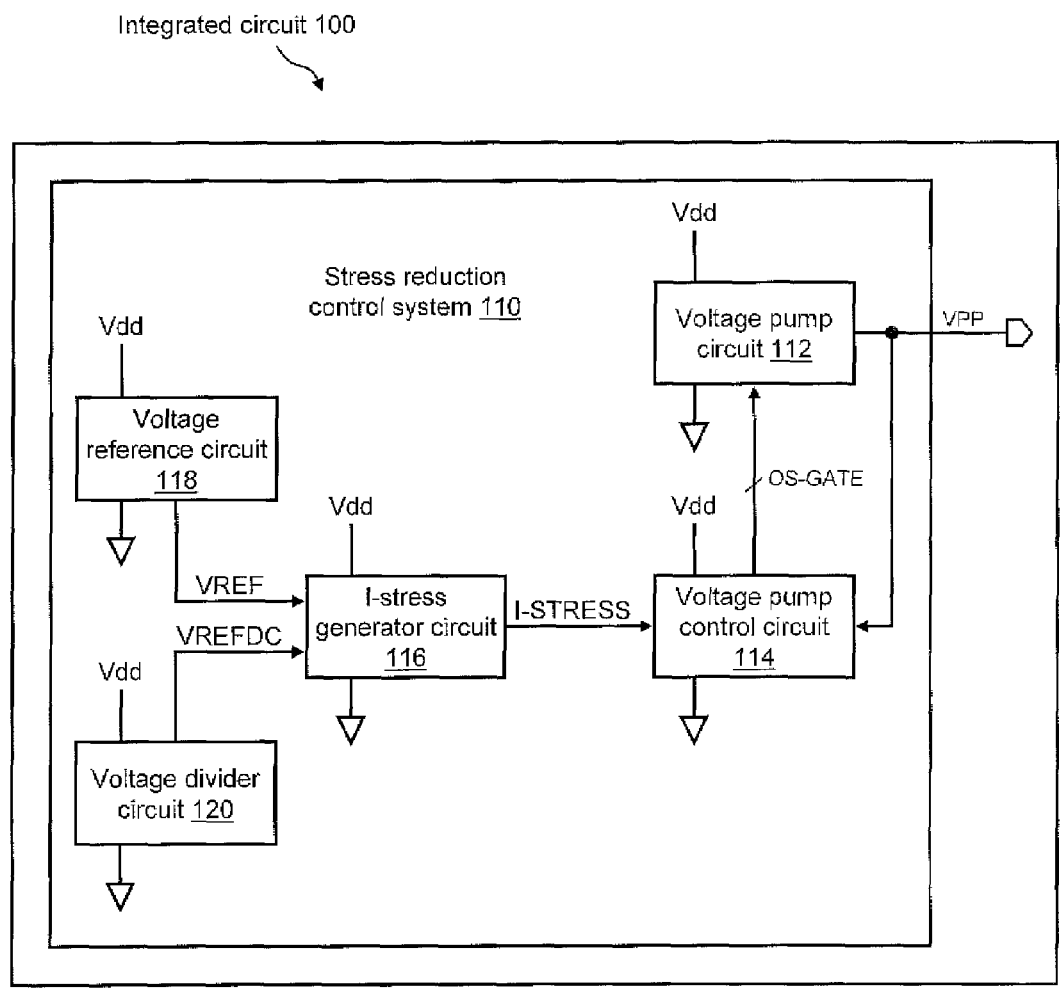
FIG. 1 is a high level block diagram of an integrated circuit that includes a stress reduction control system, which is an example of an oxide stress control mechanism in an integrated circuit.

FIG. 1 illustrates a high level block diagram of an integrated circuit 100 that includes a stress reduction control system 110, which is an example of an oxide stress control mechanism in an integrated circuit. Stress reduction control system 110 may be an oxide stress control mechanism that ensures a safe transistor gate-to-source voltage in a voltage pump circuit 112 of integrated circuit 100 that may be operating in a high-voltage condition. Consequently, stress reduction control system 110 of FIG. 1 ensures the reliability of voltage pump circuit 112 that may be operating in a high-voltage application. In one embodiment, stress reduction control system 110 of FIG. 1 includes voltage pump circuit 112, a voltage pump control circuit 114, a current-stress (I-stress) generator circuit 116, a voltage reference circuit 118, and a voltage divider circuit 120.

Voltage pump circuit 112 may be a voltage doubler circuit. In a standard voltage pump circuit (not shown), a first capacitor is charged to an input voltage and the charge from the first capacitor is then transferred over to a second capacitor in order to generate a voltage that may be approximately two times the input voltage. In one example, when the input voltage of a standard voltage pump circuit is about 1.0 volts, the voltage within the voltage pump circuit may be as high as about 2.0 volts, which may exceed the gate-to-source voltage limits of its output stage transistor device. In contrast, voltage pump circuit 112 of FIG. 1 operates in combination with voltage pump control circuit 114 which limits conditionally, the gate-to-source voltage of the output stage transistor device (not shown) of voltage pump circuit 112 to safe levels. In particular, voltage pump control circuit 114 is electrically connected, for example, between a core logic power supply Vdd of integrated circuit 100 and ground. In particular, Vdd may be the input voltage to voltage pump circuit 112 and voltage pump circuit 112 subsequently generates an output voltage VPP that may be equal to approximately Vdd×2. An output stage transistor of voltage pump circuit 112 supplies voltage VPP to voltage pump control circuit 114 as well as to other circuitry (not shown) within integrated circuit 100.

By use of a gate voltage OS-GATE, voltage pump control circuit 114 conditionally limits the down level of gate voltage OS-GATE of the output stage transistor of voltage pump circuit 112 to safe levels when Vdd exceeds a certain value only. In contrast, when Vdd is less than a certain value, the down level of gate voltage OS-GATE of the output transistor of voltage pump circuit 112 is allowed to operate normally, for full device overdrive because it is operating within a safe low-stress voltage range. Therefore, when Vdd is less than a certain value, the gate-to-source voltage of the output transistor is not limited and, thus, the output transistor is allowed to operate at a maximum overdrive level. More details of voltage pump circuit 112 and voltage pump control circuit 114 are described with reference to FIG. 2.

I-stress generator circuit 116, voltage reference circuit 118, and voltage divider circuit 120 are electrically connected, for example, between core logic power supply Vdd of integrated circuit 100 and ground as illustrated in FIG. 1. I-stress generator circuit 116 provides a mechanism for monitoring the value of Vdd and supplies a voltage node I-STRESS that is connected to voltage pump control circuit 114, the value of which reflects when Vdd is either less than or greater than a predetermined voltage value. Node I-STRESS is a certain level when Vdd is less than or equal to a certain predetermined value that is associated with a low-stress condition and, thus, voltage pump control circuit 114 responds by taking no corrective action. However, node I-STRESS is another certain level when Vdd is greater than a certain predetermined value that is associated with a high stress condition and, thus, voltage pump control circuit 114 responds by taking corrective action.

Voltage reference circuit 118 may be any voltage reference source that supplies a fixed and stable output voltage VREF to I-stress generator circuit 116. Voltage VREF remains at a fixed and stable value regardless of variations in the Vdd value. Voltage divider circuit 120 may be any voltage divider circuit that supplies an output voltage VREFDC to I-stress generator circuit 116 that is a fraction of its input voltage (e.g. a fraction of Vdd). In one example, voltage reference circuit 118 may be a bandgap reference circuit. In another example, voltage divider circuit 120 may be a resistor divider circuit that supplies voltage VREFDC that varies as a fraction of the Vdd value. The difference between voltages VREF and VREFDC is reflected at node I-STRESS of I-stress generator circuit 116. When Vdd is a less than or equal to a certain value such that voltage VREFDC is less than or equal to voltage VREF, I-stress generator circuit 116 interprets this state as a low-stress condition, which is reflected by a certain level at node I-STRESS. However, when Vdd rises to a certain high value such that the voltage VREFDC is greater than the voltage VREF, I-stress generator circuit 116 interprets this state as a high stress condition, which is reflected by a certain level at node I-STRESS. More details of I-stress generator circuit 116, voltage reference circuit 118, and voltage divider circuit 120 are found with reference to FIG. 2.

Figure 2:
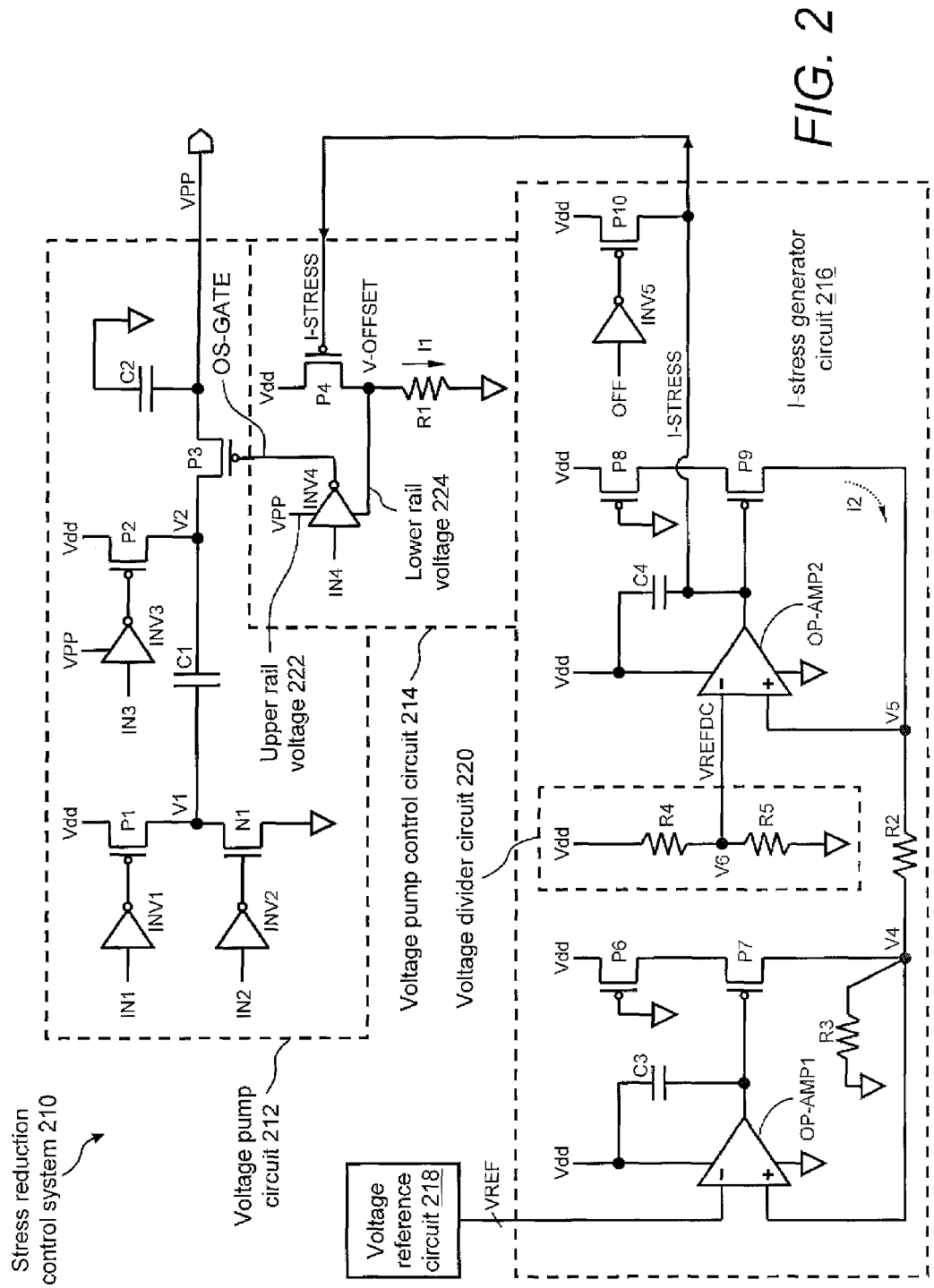
FIG. 2 is a schematic diagram of one example of a stress reduction control system suitable for use as the stress reduction control system of FIG. 1.

FIG. 2 illustrates a schematic diagram of a stress reduction control system 210, which is one exemplary embodiment of stress reduction control system 110 of FIG. 1. More specifically, stress reduction control system 210 of FIG. 2 includes a voltage pump circuit 212, a voltage pump control circuit 214, an I-stress generator circuit 216, a voltage reference circuit 218, and a voltage divider circuit 220. Voltage pump circuit 212 is electrically coupled between voltage Vdd and ground. Voltage pump circuit 212 operates in two phases: (1) a first phase to charge a "lift" capacitor C1 to about Vdd×1 and (2) a second phase to lift the charge across capacitor C1 to about Vdd×2. Capacitor C1 is connected between a first voltage node V1 and a second voltage node V2. In one example, the value of C1 may be 50 picofarads (pF). Voltage node V1 is a node between a p-type field-effect transistor (PFET) P1 and an n-type field-effect transistor (NFET) N1 that are electrically connected in series between Vdd and ground. Transistor P1 is controlled via a first input IN1 that is buffered by a first inverter INV1. Transistor N1 is controlled via a second input IN2 that is buffered by a second inverter INV2. Voltage node V1 is a node that is either pulled to Vdd via a transistor P2, which is controlled via a third input IN3 that is buffered by a third inverter INV3, or allowed to float. The voltage value of V2 feeds an output stage transistor P3 that supplies voltage node VPP, which may be the approximately "doubled" voltage, to circuitry (not shown) within an integrated circuit that requires a voltage level that is elevated compared with Vdd. A filter capacitor C2 stores the charge at node VPP, in order to satisfy instantaneous current requirements at node VPP. The gate of P3 is controlled by the signal OS-GATE from voltage pump control circuit 214.

In the first phase of operation, input IN1=logic 0 and input IN2=logic 0 and, thus, transistor P1 is off and transistor N1 is on, which pulls node V1 to about ground (i.e., about 0.0 volts). Additionally, input IN3=logic 1 and, thus, transistor P2 is on, which pulls node V2 to Vdd and thereby precharges capacitor C1 to about Vdd×1. In one example, when Vdd is about 1.0 volts, capacitor C1 is precharged to about 1.0 volts.

In the second phase of operation, input IN3=logic 0 and, thus, transistor P2 is off, which allows node V2 to float (i.e., allows the side of capacitor C1 that is precharged to about Vdd×1 to float). Additionally, input IN1=logic 1 and input IN2=logic 1 and, thus, transistor P1 is on and transistor N1 is off, which pulls node V1 to Vdd. In doing so, the side of capacitor C1 that is at about ground at the completion of the first phase is now lifted to about Vdd×1 and because capacitor C1 is already charged to about Vdd×1 and because node V2 is floating, the voltage at node V2 rises by about Vdd×1 (e.g., the voltage at V1). At the completion of the second phase, the node V2 equals the value of node V1 plus the charge of capacitor C1, or about Vdd×2. In one example, when Vdd is about 1.0 volts, at the completion of the second phase the node V2 is about Vdd×2 or about 2.0 volts. However, because there are losses due to current leakage, and parasitic capacitance in an integrated circuit, that actual value of node V2 is slightly less then Vdd×2. For example, when Vdd is about 1.0 volts, node V2 may be about 1.7 volts to 1.8 volts. The greater the voltage value at node V2, the greater the current capacity of the output transistor P3. As needed, voltage pump circuit 212 is cycled in order to supply more charge into filter capacitor C2 and, thus, a desired voltage level is maintained at voltage node VPP.

In one aspect, stress reduction control system 110 of FIG. 1 is utilized in order to avoid a gate-to-source stress condition at the output stage of the voltage pump under high-voltage conditions in an integrated circuit. By way of example and referring to FIG. 2, an aspect of stress reduction control system 210 is to prevent a gate-to-source stress condition from occurring at output transistor P3 of voltage pump circuit 212 when node VPP reaches a certain high value.

The gate voltage of output transistor P3 of voltage pump circuit 212 is controlled via gate voltage OS-GATE of voltage pump control circuit 214 that is supplied by an inverter INV4 of voltage pump control circuit 214, which is a buffer for a fourth input IN4. Gate voltage OS-GATE, may be in one of three states, i.e., a normal high state, a normal low state, and a conditional low-plus-offset state, which may be described as follows:

1. Normal high state: when input IN4=logic 0, gate voltage OS-GATE may be a logic high level that may be about the value an upper rail voltage 222 of INV4. In one example, when upper rail voltage 222 is connected to node VPP and when Vdd is about 1.0 volts, in normal high state the gate voltage OS-GATE may be about 1.7 volts to 1.8 volts;
2. Normal low state: when input IN4=logic 1, gate voltage OS-GATE may be a logic low level that may be about the value a lower rail voltage 224 of INV4. In one example, when lower rail voltage 224 is set to ground (e.g., 0 volts), in normal low state the gate voltage OS-GATE may be about the value of ground; and
3. Low-plus-offset state: when input IN4=logic 1, gate voltage OS-GATE may be a logic low level that may be about the value lower rail voltage 224 of INV4 that may be offset, for example, by a few hundred millivolts (mV) above ground. This state is created conditionally in that it is created only when a potential oxide stress condition is present within voltage pump circuit 212. In one example, when lower rail voltage 224 is set to about 200 mV above ground, in low-plus-offset state the gate voltage OS-GATE may be about 0.2 volts.

When node VPP, which is connected to the drain of transistor P3, is less than or equal to a certain value, gate voltage OS-GATE, may be allowed to be in either normal high state or normal low state because the gate-to-source voltage of transistor P3 is not in a high stress condition. In this case, the gate of transistor P3 may be allowed to swing fully between about VPP and about ground and transistor P3 operates in a low-stress condition with maximum overdrive. However, when node VPP is greater than certain value, gate voltage OS-GATE may be allowed to be in either normal high state or low-plus-offset state, in order to prevent the gate-to-source voltage of transistor P3 from being in a high stress condition. In this case, the gate of transistor P3 may not be allowed to swing fully between about VPP and about ground. Rather, the down level of the gate of transistor P3 is limited. Consequently, the gate of transistor P3 may be allowed to swing between about VPP and about a few hundred millivolts above ground only, which limits the gate-to-source voltage to within a safe low-stress range and, thus, an over stress condition is avoided at transistor P3. As a result, transistor P3 may operate in a low-stress condition, but with slightly less than maximum overdrive.

In one example, if a high oxide stress condition is defined as a gate-to-source voltage of about 1.8 volts, when Vdd is a level such that node VPP may be about 1.8 volts, the gate of transistor P3 must not be allowed to swing fully between about VPP and ground. For example, when gate voltage OS-GATE is in low-plus-offset state, the down level for the gate of transistor P3 may not be allowed to drop below about 200 mV above ground. As a result, the gate-to-source voltage of transistor P3 is limited to 1.8 volts minus 0.2 volts or about 1.6 volts and, thus, the maximum gate-to-source voltage is limited to within low-stress levels and an oxide stress condition is avoided.

In addition to normal high state and normal low state, the key to providing the low-plus-offset state at the gate of transistor P3 (via gate voltage OS-GATE) is controlling lower rail voltage 224 of INV4. In particular, lower rail voltage 224 is connected to a voltage node V-OFFSET, which is a voltage node between a transistor P4 and a resistor R1 that may be electrically connected in series between Vdd and ground (respectively) within voltage pump control circuit 214, as shown in FIG. 2. The voltage value of node V-OFFSET, which is lower rail voltage 224 of INV4, is controlled by transistor P4, the gate of which is controlled via the node I-STRESS of I-stress generator circuit 216.

In particular, when Vdd is less than or equal to a certain value, node I-STRESS may be a certain high level and transistor P4 is turned off. Therefore, no current I1 is flowing through resistor R1, which means that no voltage drop develops across resistor R1 and, therefore, node V-OFFSET goes to about ground. As a result, lower rail voltage 224 of INV4 goes to about ground and gate voltage OS-GATE may be allowed to be in either normal high state or normal low state, wherein its down level is not limited. Alternatively, when Vdd is greater than a certain value, node I-STRESS may be a certain low level and transistor P4 is turned on to a certain controlled degree. Therefore, a certain controlled current I1 is flowing through resistor R1, which means that a certain controlled voltage drop develops across resistor R1 and, therefore, node V-OFFSET rises slightly to a certain controlled value above ground, i.e., a certain controlled offset that is slightly above ground is developed at node V-OFFSET. As a result, lower rail voltage 224 of INV4 goes to about a few hundred millivolts above ground and gate voltage OS-GATE may be allowed to be in either normal high state or low-plus-offset state, wherein its down level is limited. More details of the generation of the node I-STRESS are described below with reference to I-stress generator circuit 216.

I-stress generator circuit 216 may be a balance circuit within which a key component is a resistor R2 which is connected between a first voltage node V4 and a second voltage node V5 of the balance circuit. In particular, resistor R2 is arranged between a first unity-gain amplifier circuit that controls node V4 and a second unity-gain amplifier circuit that controls node V5. In one example, I-stress generator circuit 216 may include a first operational amplifier (op-amp) OP-AMP1 that controls voltage node V4 and a second op-amp OP-AMP2 that controls voltage node V5. OP-AMP1 and OP-AMP2 are conventional differential amplifier devices that have a gain of about 1.0 and are connected in a negative feedback configuration, whereby OP-AMP1 and OP-AMP2 are each comparing two input voltages and generating an output that reflects the difference therebetween.

Voltage reference circuit 218, which may be, for example, a bandgap voltage generator, supplies a fixed and stable output voltage VREF to a negative input of OP-AMP1. OP-AMP1 provides isolation back to voltage reference circuit 218. The negative feedback configuration of OP-AMP1 includes an enable transistor P6, a pass transistor P7, and a resistor R3. Transistor P6 and transistor P7 are connected in series between Vdd and node V4, as shown in FIG. 2. Additionally, resistor R3 is connected between node V4 and ground and a positive input of OP-AMP1 is connected to node V4. In one example, resistor R3 may be about 50.0 Kohms. Resistor R3 may be sized to provide adequate source impedance for the voltage at node V4, and may be sized at a value where current flowing from node V5 has little effect on node V4. Furthermore, a capacitor C3, which is a decoupling capacitor, is connected between Vdd and the output of OP-AMP1. The gate of transistor P7 is controlled via the output of OP-AMP1, which has been configured as a unity-gain op-amp in a negative feedback loop with node V4 via transistor P7. In this negative feedback circuit with OP-AMP1, node V4 may be held at a value that is substantially equal to voltage VREF, which is a fixed and stable voltage that does not vary with variations in Vdd. In doing so, OP-AMP1 essentially provides a battery voltage at node V4, which is connected to one side of resistor R2.

Voltage divider circuit 220 may be any voltage divider circuit that supplies an output voltage VREFDC that is a fraction of its input voltage. In one example, voltage divider circuit 220 may be a resistor divider circuit that is formed of, for example, a resistor R4 and a resistor R5 that are connected in series between Vdd and ground. In this example, a voltage node V6 between resistor R4 and resistor R5 supplies voltage VREFDC that varies as a fraction of the Vdd value. Voltage VREFDC is connected to a negative input of OP-AMP2. OP-AMP2 provides isolation back to voltage divider circuit 220. The negative feedback configuration of OP-AMP2 includes an enable transistor P8 and a pass transistor P9. Transistor P8 and transistor P7 are connected in series between Vdd and node V5, as shown in FIG. 2. Additionally, a positive input of OP-AMP2 is connected to node V5. Furthermore, a capacitor C4, which is a decoupling capacitor, is connected between Vdd and the output of OP-AMP2. The gate of transistor P9 is controlled via the output of OP-AMP2 which has been configured as a unity-gain op-amp in a negative feedback loop with node V5 via transistor P9. In this negative feedback circuit with OP-AMP2, node V5 may be held at a value that is substantially equal to voltage VREFDC, which varies as a fraction of the Vdd value. In doing so, OP-AMP2 isolates voltage VREFDC and supplies a current I2 via transistor P9 to node V5 that is sufficient to hold node V5, which is connected to one side of resistor R2, at a value that is substantially equal to voltage VREFDC. The current I2 is proportional to the difference between the voltage values of node VREFDC and node VREF. Additionally, the current I2 flows through resistor R2 and is proportional to the voltage drop across resistor R2 divided by its resistance.

Optionally, an inverter INV5 of I-stress generator circuit 216 that is driven by an input OFF controls a transistor P10 that is connected between Vdd and the output of OP-AMP2, which is the node I-STRESS. In doing so, when input OFF=logic 1 the node I-STRESS is disabled and when input OFF=logic 0 the node I-STRESS is enabled. Therefore, the input OFF essentially provides a global disable function to I-stress generator circuit 216. The global disable function may further include a switching means to disable the enable transistors P6 and P8, and op-amps OP-AMP1 and OP-AMP2 to reduce power consumption when node I-STRESS is disabled.

An aspect of I-stress generator circuit 216 is that the node VREFDC voltage being less than or equal to the node VREF voltage is an indication that the Vdd voltage and resulting node VPP voltage are sufficiently low that a low-stress condition is present at output transistor P3 of voltage pump circuit 212 and that no corrective action is required. Another aspect of I-stress generator circuit 216 is that the node VREFDC voltage being greater than the node VREF voltage is an indication that the Vdd voltage and resulting node VPP voltage are sufficiently high that an unacceptably high stress condition may be present between the gate and source of output transistor P3 of voltage pump circuit 212 and, consequently, that corrective action is required. These aspects of I-stress generator circuit 216 are accomplished as follows.

The current I2 value may be the greater of zero or VREFDC voltage minus VREF voltage divided by the value of resistor R2, i.e., the greater of zero or (VREFDC−VREF)/R2. In particular, when the voltage at node VREFDC is less than or equal to the voltage at node VREF the current I2 is zero and, thus, there is no current flow through resistor R2 of I-stress generator circuit 216. In contrast, when the voltage at node VREFDC is greater than the voltage at node VREF the current I2 is greater than zero and, thus, a voltage drop develops across resistor R2.

The output of OP-AMP2 is the node I-STRESS which is connected to the gate of transistor P4 of voltage pump control circuit 214, as shown in FIG. 2 and, thus, the operation of transistor P4 is in reaction to node I-STRESS. In doing so, the transistor P4/resistor R1 combination of voltage pump control circuit 214 forms a current mirror mechanism with respect to the transistor P9/resistor R2 combination of I-stress generator circuit 216. In other words, a current I1 through transistor P4 and resistor R1 of voltage pump control circuit 214 is proportional to the current I2 of I-stress generator circuit 216.

As a result, in a low-stress condition, when the voltage at node VREFDC is less than or equal to the voltage at node VREF there is no current I2 flowing through transistor P9 and resistor R2. Consequently, in reaction to node I-STRESS, there is no current I1 flowing through transistor P4 and resistor R1, and thus, node V-OFFSET of voltage pump control circuit 214, which is lower rail voltage 224 of INV4, is at about ground. Consequently, gate voltage OS-GATE may operate in either normal high state or normal low state and not in low-plus-offset state. In contrast, in a potential stress condition, when the voltage at node VREFDC is greater than the voltage at node VREF and the current I2 is greater than zero, there is current I1 flowing through transistor P9 and resistor R2 of I-stress generator circuit 216. Consequently, in reaction to node I-STRESS, transistor P4 of voltage pump control circuit 214 is turned on such that its current I1 is proportional to current I2 of I-stress generator circuit 216. A voltage drop develops across resistor R1 which is proportional to current I1 and, thus, node V-OFFSET of voltage pump control circuit 214, which is lower rail voltage 224 of INV4, is at about a few hundred millivolts above ground. Consequently, gate voltage OS-GATE may operate in either normal high state or low-plus-offset state and not in normal low state, wherein its down level is limited. In this way an oxide stress condition between the gate and source of output transistor P3 of voltage pump circuit 212 is avoided.

The operating voltages, current values, and resistance values that are associated with stress reduction control system 210 of FIG. 2 are determined as follows.

1. define the fixed voltage VREF;
2. define a voltage Vdd-stress as the Vdd voltage value at which the oxide stress is at the maximum;
3. define the value of resistors R4 and R5 such that VREFDC=VREF at Vdd-stress;
4. select the value of resistor R2 in order to create a current I2=(VREFDC−VREF)/R2;
5. select a current mirror multiplication factor M, where M=transistor P4 width (W4) divided by transistor P9 width (W9), or M=W4/W9.;
6. select the value of resistor R1 in order to achieve a desired offset voltage V-OFFSET, where V-OFFSET=M×I2×R1; and
7. select the value of resistor R1 for adequate AC response. The value of resistor R1 must be sufficiently small to ensure adequate AC response, as there is a practical limit for this value such that resistor R1 is not so large that it impacts the normal discharge of node OS-GATE.

In one example, VREF=about 0.55 volts, Vdd-stress=about 1.8 volts when Vdd=about 1.0 volts, resistor R4=about 16.5 Kohms and resistor R5=about 20.0 Kohms for VREFDC=about 0.55 volts when Vdd=about 1.0 volts, resistor R2=about 13.75 Kohms and thus current I2=(VREFDC−

0.55 v)/13.75 Kohms, M=10, and R1=about 2.5 Kohms for V-OFFSET=M×I2×R1, where V-OFFSET=about 200 mV.

In this example, when Vdd=about 1.0 volts, current I2=about 0 microamps and, thus, the current I1 through transistor P4 and resistor R1=about 0 microamps and, thus, node V-OFFSET=2.5 Kohms×0 microamps=0 mV (i.e., no offset in the down level of gate voltage OS-GATE is developed). However, when Vdd=about 1.2 volts, current I2=about 8 microamps and, thus, for an M=10 the current I1 through transistor P4 and resistor R1=about 80 microamps and, thus, node V-OFFSET=2.5 Kohms×80 microamps=about 200 mV (i.e., a 200 mV offset in the down level of gate voltage OS-GATE is developed, which creates low-plus-offset state). As a result, at the output stage of voltage pump circuit 212, the gate of transistor P3 is at least about 200 mV above ground when the source of transistor P3 is about 1.8 volts (i.e., node VPP value=about 1.8 volts). Consequently, the gate-to-source voltage is limited to about 1.8 volts minus 0.2 volts or about 1.6 volts, which is within the safe low-stress range, and an oxide stress condition at transistor P3 of voltage pump circuit 212 is avoided.

In summary, stress reduction control system 110 provides a mechanism for avoiding an oxide stress condition in a voltage pump, such as voltage pump circuit 212 of stress reduction control system 210, by controlling of the gate voltage level of the output device, such as output transistor P3. For example, the down level of the gate voltage of transistor P3 may be conditionally limited. In particular, an offset in the down level of the gate voltage is created by conditionally developing an offset voltage in the lower rail voltage of the gate driver, such as lower rail voltage 224 of INV4. The offset voltage is created by directing a predetermined current through a resistance, such as current I1 through resistor R1. The current may be determined by the difference between a fixed voltage, such as VREF, and a voltage, such as VREFDC, that is a fraction of the power supply voltage, such as a fraction of Vdd. Subsequently, a current, such as current I1, is provided that is proportional to the difference between VREF and VREFDC. The current, such as current I1, is conditional such that current I1 is about zero when Vdd is less than or equal to a predetermined level, and current I1 is greater than zero when Vdd is greater than a predetermined level. The current, such as current I1, is determined by directing another current through a reference resistor, such as current I2 through resistor R2, via a pair of unity gain amplifiers (e.g., OP-AMP1 and OP-AMP2), where the first unity gain amplifier is coupled to a fixed voltage, such as VREF and the second unity gain amplifier is coupled to a voltage, such as VREFDC, that is proportional to the supply voltage.

Stress reduction control system 210 of FIG. 2 is but one example embodiment of stress reduction control system 110 of FIG. 1. In particular, stress reduction control system 210 is not limited to the circuit arrangement that is shown in the schematic diagram of FIG. 2. Those skilled in the art will appreciate that the functions of stress reduction control system 210 may be implemented using other arrangements of electronic components. In one example, all polarities within stress reduction control system 210 may be inverted and, thus, all NFETS may become PFETS and all PFETS may become NFETS. In another example a plurality of voltage pumps may be in electrical communication with a single I-STRESS generator circuit to control the oxide stress levels in each pump by using current mirroring techniques with node I-STRESS.

An exemplary embodiment has been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit designed to substantially operate at a supply voltage, comprising:
   circuitry requiring a boosted voltage relative to the supply voltage;
   a voltage pump that includes an output device in electrical communication with said circuitry so as to provide said circuitry with said boosted voltage, said output device driven by a gate voltage having a gate drive level and including a gate-oxide having an excessive stress voltage level; and
   a gate voltage controller for generating said gate drive level so as to maintain said gate oxide below said excessive stress level;
   wherein:
      said gate voltage has a down level and said gate voltage controller is operatively configured to maintain via an analog signal said gate oxide below said excessive stress level by adjusting said down level;
      said gate voltage controller is operatively configured to adjust said down level by generating an offset voltage;
      said gate voltage controller includes a first resistance and is configured to generate said offset voltage as a function of directing a predetermined first current through said first resistance; and
      said gate voltage controller is configured to generate said predetermined first current as a function of a difference between a first reference voltage and a second reference voltage.

2. The integrated circuit of claim 1, wherein said second reference voltage is a fraction of the supply voltage.

3. The integrated circuit of claim 1, wherein said gate voltage controller is configured to make said predetermined first voltage equal to zero volts when the supply voltage is at a predetermined level and greater than zero volts when the supply voltage is greater than said predetermined level.

4. The integrated circuit of claim 1, wherein said gate voltage controller comprises a second resistance, a first unity gain amplifier coupled to a first voltage proportional to the supply voltage, and a second unity gain amplifier coupled to a second voltage that is fixed, said gate voltage controller operatively configured to generate said predetermined first current as a function of directing a second predetermined current through said second resistor via said first unity gain amplifier and said second unity gain amplifier.

5. The integrated circuit of claim 1, wherein said gate voltage controller comprises an output inverter having a down level and said offset voltage is a function of said down level of said output inverter.

6. An integrated circuit designed to operate at a supply voltage, comprising:
   voltage pump circuitry that includes an output device having a gate drive level and including a gate oxide having an excessive stress level; and
   a gate voltage controller electrically connected to said output device so as to provide said gate drive level, said gate voltage controller configured to vary said gate drive level as a function of said supply voltage;
   wherein said gate voltage controller is configured to generate said gate drive level as a function of a reference current.

7. The integrated circuit of claim 6, wherein said gate voltage controller includes a current generator circuit for generating said reference current as a function of a first predetermined reference voltage and a second predetermined reference voltage.

8. The integrated circuit of claim 7, wherein said current generator circuit comprises a first unity gain amplifier responsive to said first predetermined reference voltage and a second unity gain amplifier responsive to said second predetermined reference voltage.

9. The integrated circuit of claim 8, wherein said second unity gain amplifier has an output node, said reference current occurring on said output node when said current generator circuit is operating.

10. An integrated circuit, comprising:
   a voltage pump circuit including an output transistor having a gate input and responsive to a gate drive level;
   a voltage pump control circuit electrically connected to said gate input of said output transistor and configured to output said gate drive level in response to a reference current;
   a reference current generator electrically connected to said voltage pump control circuit so as to provide said voltage pump control circuit with said reference current; said reference current generator configured to generate said reference current as a function of a first reference voltage and a second reference voltage;
   a first reference voltage generator electrically connected to said reference current generator for providing said first reference voltage to said reference current generator; and
   a second reference voltage generator electrically connected to said reference current generator for providing said second reference voltage to said current generator.

11. The integrated circuit of claim 10, wherein said voltage pump control circuit includes an inverter having an output directly connected to said gate input of said output transistor of said voltage pump circuit.

12. The integrated circuit of claim 11, wherein said inverter has a low-voltage rail node and further includes a voltage offset transistor having an output in electrical communication with said low-voltage rail, said voltage offset transistor having a gate responsive to said reference current.

13. The integrated circuit of claim 12, wherein said reference current generator includes a first unity gain amplifier electrically connected to said first reference voltage generator for receiving said first reference voltage and a second unity gain amplifier electrically connected to said second reference voltage generator for receiving said second reference voltage, said second unity gain amplifier having an output directly electrically connected to said gate of said voltage offset transistor.

14. The integrated circuit of claim 13, wherein said first unity gain amplifier has a first input and said second unity gain amplifier has a second input, wherein said first input and said second input are electrically coupled to one another across a resistance.

* * * * *